United States Patent
Hu et al.

(10) Patent No.: US 11,467,189 B2
(45) Date of Patent: *Oct. 11, 2022

(54) SWITCH MODE POWER CONVERTER CURRENT SENSING APPARATUS AND METHOD

(71) Applicant: Texas Instruments Incorporated, Dallas, TX (US)

(72) Inventors: Yongxuan Hu, Cupertino, CA (US); Mohammad Rashedul Hoque, Chandler, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 471 days.

This patent is subject to a terminal disclaimer.

(21) Appl. No.: 16/026,867

(22) Filed: Jul. 3, 2018

(65) Prior Publication Data

US 2018/0313873 A1    Nov. 1, 2018

Related U.S. Application Data

(63) Continuation of application No. 13/753,722, filed on Jan. 30, 2013.

(Continued)

(51) Int. Cl.
*G01R 19/00* (2006.01)
*G05F 1/10* (2006.01)
(Continued)

(52) U.S. Cl.
CPC ......... *G01R 19/00* (2013.01); *G01R 19/0092* (2013.01); *G05F 1/10* (2013.01);
(Continued)

(58) Field of Classification Search
CPC ....... G01R 19/00; G01R 19/0092; G05F 1/10; H02M 3/155–1588; H02M 3/158; H02M 3/1582

See application file for complete search history.

(56) References Cited

U.S. PATENT DOCUMENTS 5,287,055 A * 2/1994 Cini ................... G01R 31/2621
324/123 R
6,160,387 A * 12/2000 Moraghan ............... G05F 1/573
323/277

(Continued)

FOREIGN PATENT DOCUMENTS

CN          101902123 A      12/2010
EP             1601104         11/2005

(Continued)

OTHER PUBLICATIONS

Texas Instruments Incorporated's Documentation titled "Current-Limited, Power Distribution Switches", SLVSAU6F, Jun. 2011, Revised Nov. 2012.

(Continued)

*Primary Examiner* — Yusef A Ahmed
(74) *Attorney, Agent, or Firm* — Mark A. Valetti; Charles A. Brill; Frank D. Cimino

(57) ABSTRACT

Methods and apparatus are presented for sensing current flowing in a power transistor of a switch mode converter, in which a voltage is sensed across a first field effect transistor connected in a series circuit branch in parallel with the power transistor, and the sensed voltage is used to generate output signal to indicate the current flowing in the power transistor.

17 Claims, 7 Drawing Sheets

Related U.S. Application Data

(60) Provisional application No. 61/683,575, filed on Aug. 15, 2012.

(51) Int. Cl.
  *H02M 3/158* (2006.01)
  *H02M 3/156* (2006.01)

(52) U.S. Cl.
  CPC ........... *H02M 3/156* (2013.01); *H02M 3/158* (2013.01); *H02M 3/1582* (2013.01)

(56) References Cited

U.S. PATENT DOCUMENTS

| | | | |
|---|---|---|---|
| 6,215,286 B1 * | 4/2001 | Scoones | H02M 3/156 323/284 |
| 6,229,351 B1 * | 5/2001 | Wang | G01R 19/00 327/81 |
| 6,541,947 B1 | 4/2003 | Dittmer et al. | |
| 6,812,677 B2 | 11/2004 | Iino | |
| 6,833,690 B2 | 12/2004 | Walters et al. | |
| 6,870,352 B2 | 3/2005 | Walters et al. | |
| 7,586,367 B2 * | 9/2009 | De Lima Filho | G01R 19/0092 327/562 |
| 7,683,593 B2 * | 3/2010 | Tao | G01R 19/0092 323/277 |
| RE42,307 E | 4/2011 | Walters et al. | |
| 7,928,703 B2 | 4/2011 | Tan et al. | |
| 8,110,462 B2 | 2/2012 | Steinhoff | |
| 2002/0005738 A1 * | 1/2002 | Inn | H03F 3/345 327/51 |
| 2003/0038614 A1 | 2/2003 | Walters et al. | |
| 2004/0178779 A1 | 9/2004 | Walters et al. | |
| 2004/0217744 A1 | 11/2004 | Walters et al. | |
| 2005/0057228 A1 * | 3/2005 | Shih | H02M 1/38 323/222 |
| 2006/0028192 A1 | 2/2006 | Ryu | |
| 2006/0075152 A1 * | 4/2006 | Zhu | G06F 13/4081 710/15 |
| 2006/0097710 A1 * | 5/2006 | Xi | H02M 3/156 323/282 |
| 2006/0113979 A1 * | 6/2006 | Ishigaki | H02M 3/1588 323/282 |
| 2007/0229151 A1 | 10/2007 | Dake et al. | |
| 2008/0247099 A1 * | 10/2008 | Hojo | G05F 1/573 361/18 |
| 2008/0258697 A1 | 10/2008 | Gehrke | |
| 2008/0265850 A1 * | 10/2008 | De Lima Filho | G01R 19/0092 323/265 |
| 2010/0007217 A1 * | 1/2010 | Steele | H02J 1/001 307/131 |
| 2010/0067161 A1 * | 3/2010 | Nakajima | G01R 19/16571 361/100 |
| 2010/0134150 A1 | 6/2010 | Park | |
| 2010/0134939 A1 * | 6/2010 | Takahashi | H03K 17/0822 361/87 |
| 2010/0188057 A1 | 7/2010 | Tarng | |
| 2011/0068762 A1 * | 3/2011 | Nishida | G01R 19/0092 323/282 |
| 2011/0187340 A1 * | 8/2011 | Deval | H02M 3/158 323/285 |
| 2011/0248702 A1 * | 10/2011 | Kume | G01R 19/0092 324/119 |
| 2011/0279095 A1 * | 11/2011 | Hong | G06F 13/385 320/164 |
| 2012/0020121 A1 * | 1/2012 | Iino | H02M 3/1588 363/21.04 |
| 2012/0025796 A1 * | 2/2012 | Kahn | H02M 3/156 323/272 |
| 2012/0049818 A1 * | 3/2012 | Hester | H02M 3/1582 323/282 |
| 2014/0049238 A1 * | 2/2014 | Hu | G01R 19/0092 323/282 |
| 2015/0155781 A1 * | 6/2015 | Serdarevic | H02M 3/1588 323/282 |
| 2015/0311875 A1 * | 10/2015 | Chen | G11C 7/065 327/52 |
| 2015/0338931 A1 * | 11/2015 | Teh | G06F 3/0354 345/166 |
| 2016/0118906 A1 * | 4/2016 | Freeman | H02M 7/06 363/21.05 |
| 2017/0089958 A1 * | 3/2017 | Guntreddi | G01R 19/0092 |
| 2018/0307260 A1 * | 10/2018 | Nagai | G05F 1/575 |
| 2018/0331499 A1 * | 11/2018 | Bellingrath | H01S 5/068 |
| 2018/0375430 A1 * | 12/2018 | Kwak | H02M 1/32 |

FOREIGN PATENT DOCUMENTS

| | | |
|---|---|---|
| JP | 06201738 | 7/1994 |
| KR | 10-0578908 | 5/2006 |

OTHER PUBLICATIONS

PCT Search Report dated Aug. 15, 2013.
Search Report for Chinese Patent Application 201380042862.4, dated Sep. 19, 2016 (4 pages).
English Machine Translation, CN101902123A (8 pages).

* cited by examiner

US 11,467,189 B2

SWITCH MODE POWER CONVERTER CURRENT SENSING APPARATUS AND METHOD

CROSS REFERENCE TO RELATED APPLICATIONS

Under 35 U.S.C. § 120, this continuation application claims benefits of and priority to U.S. patent application Ser. No. 13/753,722 (TI-72308), filed on Jan. 30, 2013, which claims benefits of and priority to U.S. Provisional Application No. 61/683,575, filed on Aug. 15, 2012. The entirety of the above referenced applications hereby incorporated herein by reference.

FIELD OF THE INVENTION

The present disclosure relates to power conversion circuitry, and more particularly to apparatus and methods for sensing switch mode power converter current without series sensing components.

BACKGROUND OF THE INVENTION

Power conversion circuitry is employed in many applications, such as in portable devices using external power from a universal serial bus (USB) connection to operate the device and/or to charge internal batteries. In many instances, the current drawn from a source may need to be limited, for example, according to specifications published for devices drawing power from a USB connection. For instance, portable devices are limited to drawing at most 100 mA from a USB 2.0 connection, unless a higher limit (e.g., up to 500 mA) is negotiated. Similarly, USB 3.0 connections are typically limited to drawing 150 mA unless a higher amount (e.g., up to 900 mA) is negotiated. Accordingly, power management circuitry in many portable devices provides input power conversion with current limiting, using on-board input current sensing via a sense resistor or sense FET connected between the power input terminal and the high-side power FET. High-side current sensing may also be important in other types of power converters, such as for sensing and regulating output current flow from a boost converter or a buck/boost converter. However, the conventional current sensing approach incurs significant power loss in terms of heat generated by conduction of high-side current flowing through the sensing device. Moreover, the sensing component (e.g., resistor or FET) must be sized to accommodate the maximum level of input current, and accordingly the sensing device occupies a significant amount of space in terms of integrated circuit die area and/or external board area, thereby increasing cost. Accordingly, improved current sensing apparatus and techniques are desirable by which sensing component power dissipation and/or sensing component size and cost may be reduced.

SUMMARY OF THE INVENTION

The present disclosure provides integrated circuits as well as sensing apparatus and methods for sensing power converter currents using sensing circuitry coupled in parallel with power FETs. Accordingly, embodiments may facilitate reduction in sensing device size and power loss without use of series-connected sensing components as was done in the past. The disclosed apparatus and techniques thus find particular utility in portable electronic devices such as portable computers, laptop computers, notebook computers, PDAs, portable phones, tablets, MP3 players, etc., as well as in power management integrated circuits (ICs) thereof which convert power received via USB or other external connections. Moreover, the present disclosure finds utility in a variety of applications in which currents flowing through power conversion transistors are to be measured.

Integrated circuits and sensing apparatus thereof are disclosed, for sensing current flowing through a power FET of a switch mode converter. The sensing apparatus includes first and second FETs connected in series, a parallel power FET, along with sensing circuitry providing an output representing the current flowing in the power FET based at least in part on a voltage across the first FET. In certain embodiments, the first FET is connected between a high-side power FET terminal and a first circuit node, where the first FET is driven by a constant voltage gate signal. Certain embodiments provide a capacitance coupled between the first circuit node and a circuit ground. The second FET is connected between the first circuit node and the second high-side power FET terminal in certain implementations, with the second FET being driven by the same gate signal as is used for the high-side power FET.

The sensing apparatus in certain embodiments comprises a sense FET connected between the first high-side power FET terminal and a second circuit node, and having a gate terminal connected to the gate of the first FET, along with an amplifier circuit including an op amp with inputs coupled to the first and second circuit nodes, and an output P-type FET with a gate connected to the op amp output, a source connected to the second circuit node, and a drain providing a current output indicating the current flowing in the power transistor. In some embodiments, one or more resistors are coupled between the amplifier output and a circuit ground to receive the current output from the amplifier circuit. In certain embodiments, moreover, filter circuit components (e.g., RC components) can be placed across the resistor.

In certain embodiments, the power FET and the all the FETs in the sensing circuit are constructed using a corresponding integer number of matched transistor units formed in a semiconductor body of an integrated circuit. These integer numbers are chosen in such a way that both the sensing ratio and sensing accuracy can be relatively high and the overall sensing circuitry can be small in die area. Thus, the sensing component loss in operation can be significantly reduced compared with conventional use of series-connected sensing devices, and the die and/or circuit board area dedicated to current sensing components can be reduced.

Methods are also disclosed for sensing current flowing in a switch mode power converter high-side power FET, including sensing the voltage across a first FET connected in a series circuit branch in parallel with the high-side power FET, as well as providing an output signal based at least in part on the sensed voltage to indicate current flowing in the high-side power FET. In certain embodiments, the method includes concurrently turning on the power FET and a second FET connected in the series circuit branch according to a pulse width modulation (PWM) signal, and sensing the voltage across the first FET. In addition, a gate terminal of an output FET may be controlled using an op amp at least partially according to the sensed voltage in order to provide a current output indicating the average current flowing in the high-side power FET. Certain embodiments also involve controlling a sense FET connected between the first high-side power FET terminal and the output FET with a constant voltage provided to the gate of the first FET while sensing the voltage.

Integrated circuits are provided, which include a switch mode converter circuit with at least one power transistor, as well as a sensing apparatus as described above.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
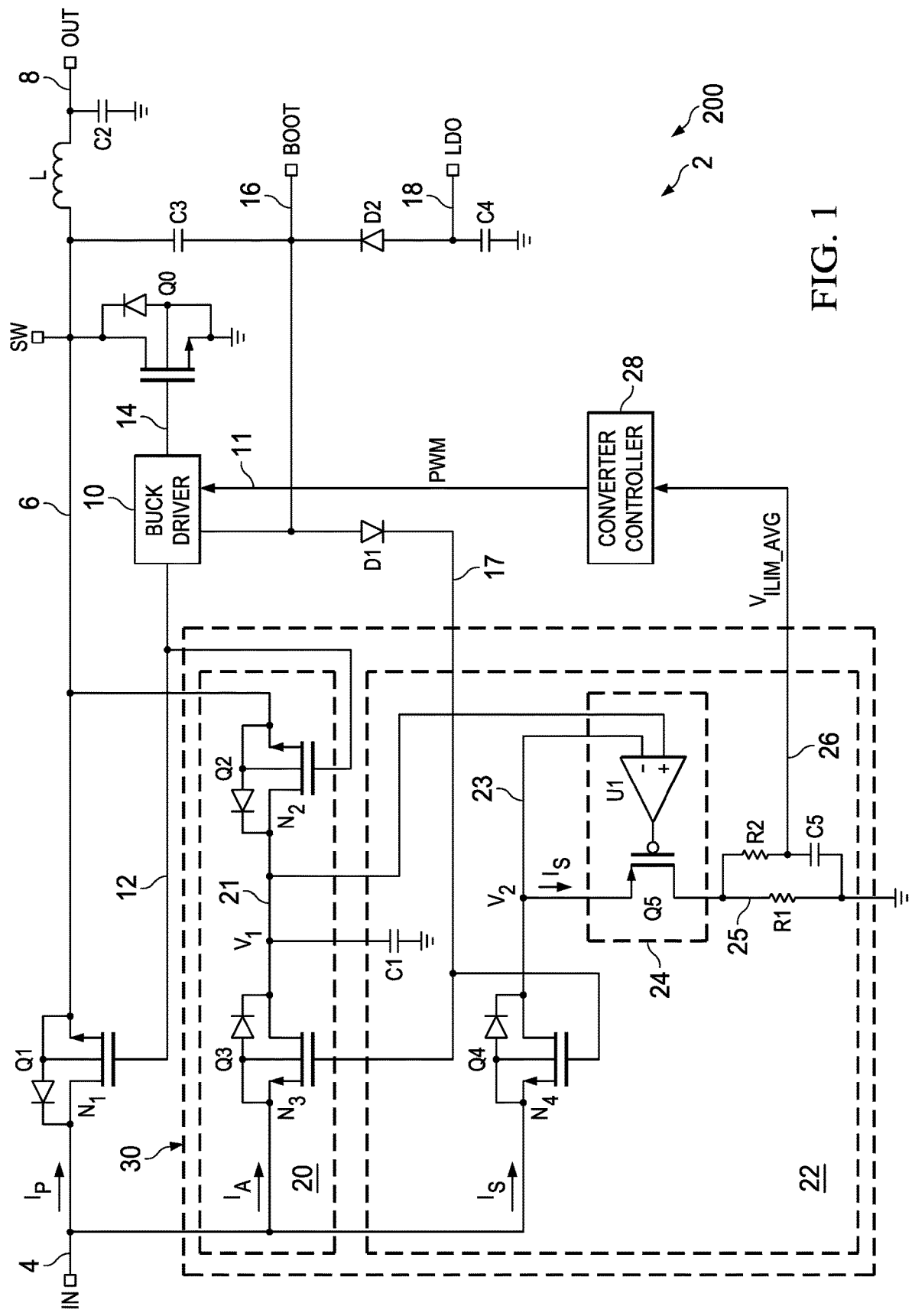
FIG. 1 is a schematic diagram illustrating a switch mode buck converter with an improved low loss current sensing circuit connected in parallel with a high-side power FET.

One or more embodiments or implementations are hereinafter described in conjunction with the drawings, wherein like reference numerals are used to refer to like elements throughout, and wherein the various features are not necessarily drawn to scale. The present disclosure provides solutions for reducing power loss, circuit size, and cost of current sensing in power conversion circuitry, and is hereinafter illustrated and described in the context of power management integrated circuits for operating portable electronic devices and/or for charging batteries thereof. However, the concepts of the present disclosure may be employed in a variety of applications, wherein the disclosure is not limited to the illustrated or described examples.

Figure 2:
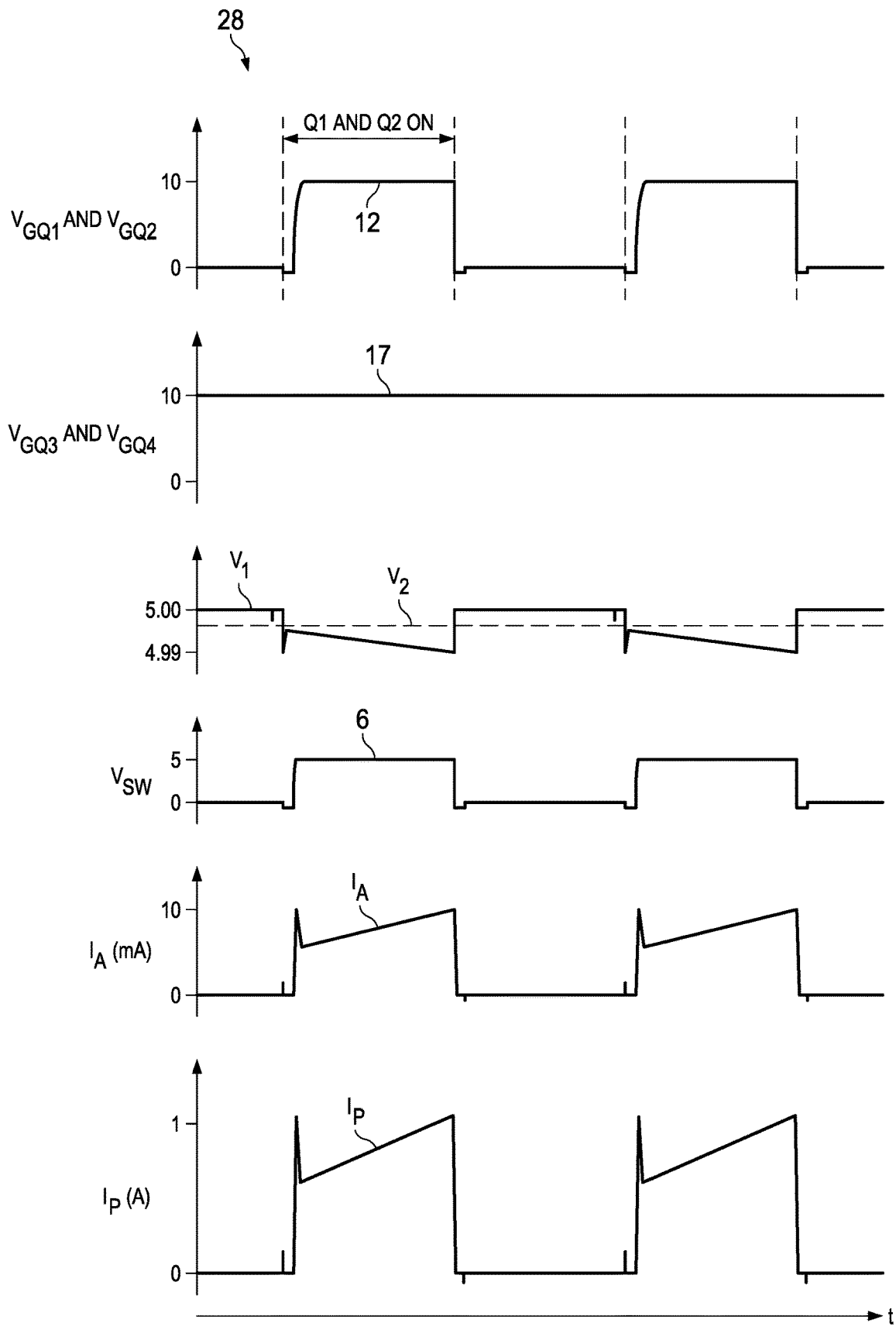
FIG. 2 is a diagram showing various voltage and current waveforms in the converter of FIG. 1.
Figure 3:
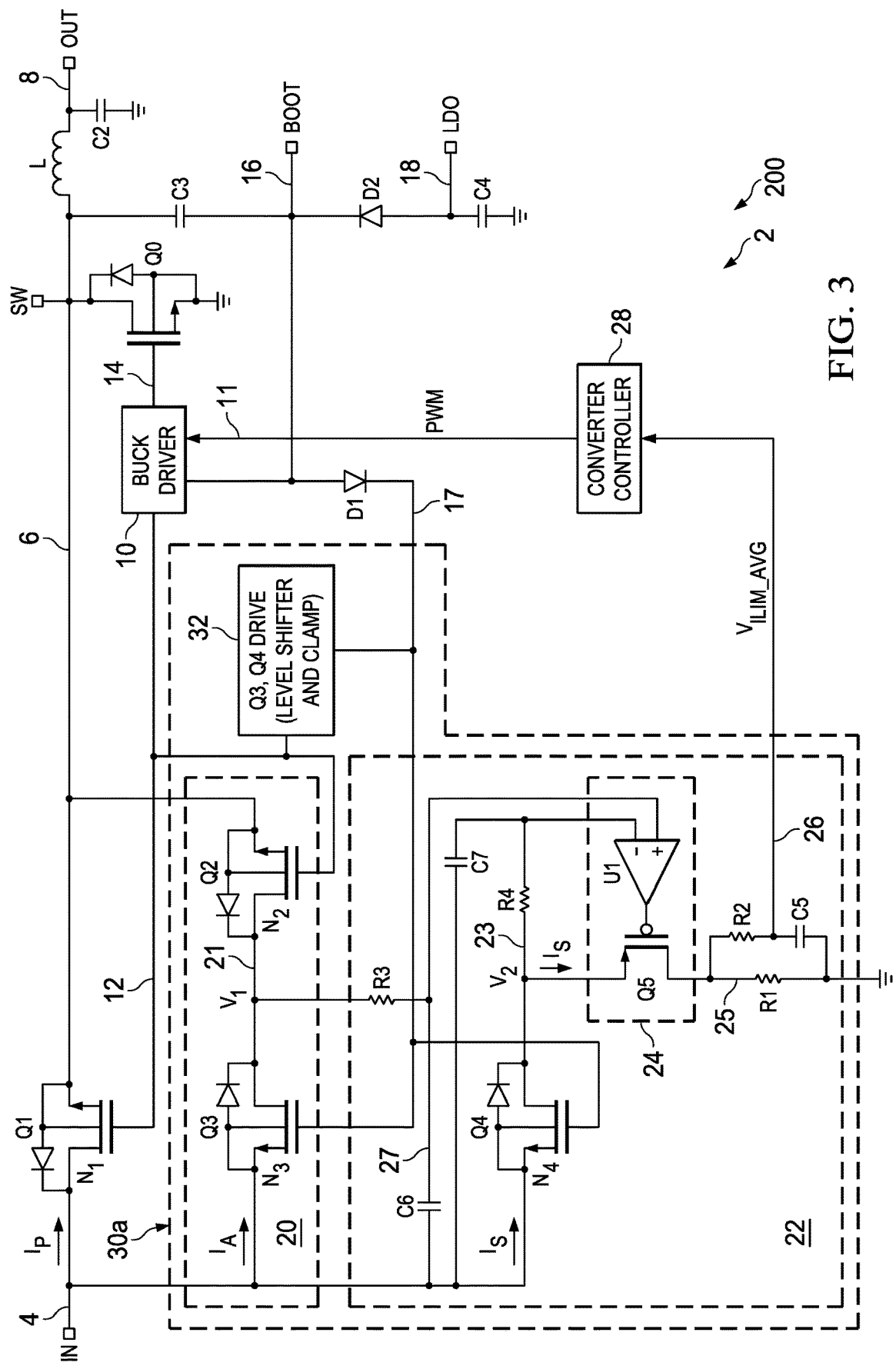
FIG. 3 is a schematic diagram illustrating a buck converter with another current sensing circuit embodiment.

Referring initially to FIGS. 1-3, FIG. 1 shows an integrated circuit (IC) 200 including a switch mode buck converter 2 with an input current sensing apparatus 30 connected in parallel with a high-side power FET Q1. The converter 2 may be part of a power management IC 200 employed in a portable electronic device (e.g., laptop computer, portable phone, etc.), and has an input terminal or node 4 (IN) from which the high-side power FET Q1 draws current $I_P$. Such buck converter applications often require input current sensing for telemetry purposes, such as in laptop PMIC applications. The high-side power FET Q1 in the illustrated embodiment is an N-channel LDMOS, although other forms and types of power transistor may be used. In the illustrated example, a drain (D) of Q1 is connected to the input terminal 4, and the source (S) of Q1 is connected to a switch node (SW) 6, with a low-side N-channel LDMOS Q0 coupled between the switch node 6 and a circuit ground. The switch node 6 is connected to an output or battery terminal 8 via a buck converter inductor L. The high and low-side devices Q1 and Q0 form a buck converter using the inductance L to provide a regulated DC output to the output terminal 8 under control of a buck converter driver circuit 10 with an output capacitor C2 connected between the output node 8 and the circuit ground in the illustrated example. The driver 10 provides a gate drive signal 12 to Q1, and provides a low-side gate drive signal 14 to Q0 as shown. Other buck converter topologies may be used, for example, in which the low-side transistor Q0 is replaced with a diode (not shown) having an anode connected to the circuit ground and a cathode connected to the switch node 6.

The buck driver 10 in certain embodiments provides alternating gate drive signals 12 and 14 according to a pulse width modulation (PWM) signal(s) or value(s) 11 from a converter controller 28. In order to effectively turn on the high-side power transistor Q1, a low drop-out (LDO) regulator, a diode D2, and capacitor C3 are needed. In operation, the buck driver 10 provides the signal 14 to turn Q0 on while Q1 is off to charge a capacitor C3 up to an LDO output voltage value (e.g., 5 V in certain implementations). Once Q0 is turned off, the BOOT node 16 is at a voltage approximately 5 V higher than the switch node 6 (e.g., 10V after Q1 is turned on and input is 5V), and the driver circuit 10 provides the high-side gate drive signal 12 for a positive gate-source voltage level sufficient to turn on the high-side transistor Q1. As seen in FIG. 1, moreover, the BOOT node 16 is connected via a first diode D1 to a sensing circuit gate drive signal node 17, and a second diode D2 has a cathode connected to the BOOT node 16 and an anode connected to a regulated supply voltage node 18 (LDO, e.g., 5 V DC in one example), with a capacitor C4 connected between the supply node 18 and the circuit ground.

The converter controller 28 may be provided with one or more feedback signals or values in order to regulate the output at the output node 8, and in the illustrated example receives an output signal 26 from the sensing apparatus 30 ($V_{ILIM\_AVG}$) indicative of the input current $I_P$ flowing through the high-side power transistor Q1. In operation, the converter controller 28 provides the PWM signal(s) or value(s) 11 in order to enforce a maximum input current limit, for instance, by comparing the sensing apparatus output signal 26 with a predefined threshold, and controlling operation of the buck converter 2 so as to not exceed the threshold limit. In particular, the predefined threshold may be set, for example, at a level corresponding to 100 mA, and a second threshold may be used, for example, at around 500 mA for USB 2.0 operation (e.g., 150 mA/900 mA for USB 3.0).

FIG. 1 illustrates one embodiment of a sensing apparatus or sensing circuit 30 for sensing the power transistor current $I_P$, including an auxiliary series circuit branch 20 connected in parallel with the power transistor Q1, as well as a sensing circuit 22 providing the output signal 26. The auxiliary circuit 20 is connected across Q1 between the input node 4 and the switch node 6, and includes a series combination of a first auxiliary (e.g., high-side sense auxiliary) transistor Q3 and a second FET Q2, where a source terminal of Q3 is connected to the input node 4, a source terminal of Q2 is connected to the switch node 6, and a first circuit node 21 joins the drain terminals of the auxiliary circuit transistors Q2 and Q3. In addition, the gate of Q2 is driven by the high-side gate drive signal 12 from the buck driver 10, whereas the gate of Q3 is driven by a constant voltage at the node 17. As seen in FIG. 1, operation of Q2 and Q3 allows selective conduction of an auxiliary current $I_A$ through the parallel circuit 20, and the exemplary auxiliary transistors Q2 and Q3 are constructed such that the auxiliary current $I_A$ is significantly smaller than the power current $I_P$ flowing through the high-side power FET Q1. Thus, compared with conventional input current sensing techniques that employed a sensing device (e.g., precision sense resistor or sensing FET) in series between the input node 4 and the high-side power FET Q1, the illustrated auxiliary circuit 20 is used for current sensing without dissipating a significant amount of power, and using components Q2 and Q3 having integrated circuit die or circuit board areas that can be significantly smaller than conventional series-connected sense resistors or sense FETs. The auxiliary current $I_A$ through the parallel circuit 20 also goes to the output as it provides a parallel path to power transistor current $I_P$.

In addition, conventional power management circuitry typically employed a mid-point capacitor connected to a node joining the series-connected sensing FET with the high-side power FET. Such mid-point capacitor is not needed in the configuration of FIG. 1, wherein a filter capacitor C1 can be connected in certain embodiments between the first circuit node 21 and circuit ground, where the value, and hence the physical size and cost, of the capacitor C1 can be significantly lower than that of previously employed mid-point capacitors. Moreover, the prior reliance on a large mid-point capacitor typically required use of an external mid-point capacitor component connected to a power management IC, whereas the IC 200 in the illustrated embodiments can employ an on-chip filter capacitor C1 as shown in FIG. 1, thereby reducing the number of external connections to the integrated circuit 200. In this regard, the pass filtering may be beneficial in such current sensing applications, particularly where the op amp U1 as a limited bandwidth and cannot track high-speed signals.

As seen in FIG. 1, moreover, the sensing apparatus 30 includes a sensing circuit 22 coupled to sense the voltage between the input node 4 and the first internal node 21 (e.g., the voltage across Q3). The sensing circuit 22 provides the output signal 26 which represents the amount of current $I_P$ flowing in Q1 based at least partially on the sensed voltage across Q3. In the embodiment of FIG. 1, the sensing circuit 22 includes a sense FET Q4 connected between the input terminal 4 and a second circuit node 23, where the gate terminal of Q4 is connected to the gate of Q3 (e.g., constant voltage gate signal provided at node 17). In operation, a sense current $I_S$ flows from the input node 4 through Q4 to the remainder of the sensing circuit 22, which includes a Vds matching amplifier circuit 24 with an operational amplifier (op amp) U1 and an output FET Q5, along with a current sense load resistor R1 connected between an amplifier circuit output node 25 and the circuit ground, as well as an optional RC filter formed by a resistor R2 and a capacitor C5 as shown. The use of the filter components R2 and C5 in this example provides the output signal 26 representing a filtered or average current flowing through the high-side power transistor Q1, although other embodiments are possible in which no filtering is provided in the sensing circuit 22. As seen in FIG. 1, the auxiliary circuit current $I_A$ does not contribute to power loss, since this current flows to the switch node 6 and thus to the output of the converter 2.

Figure 6:
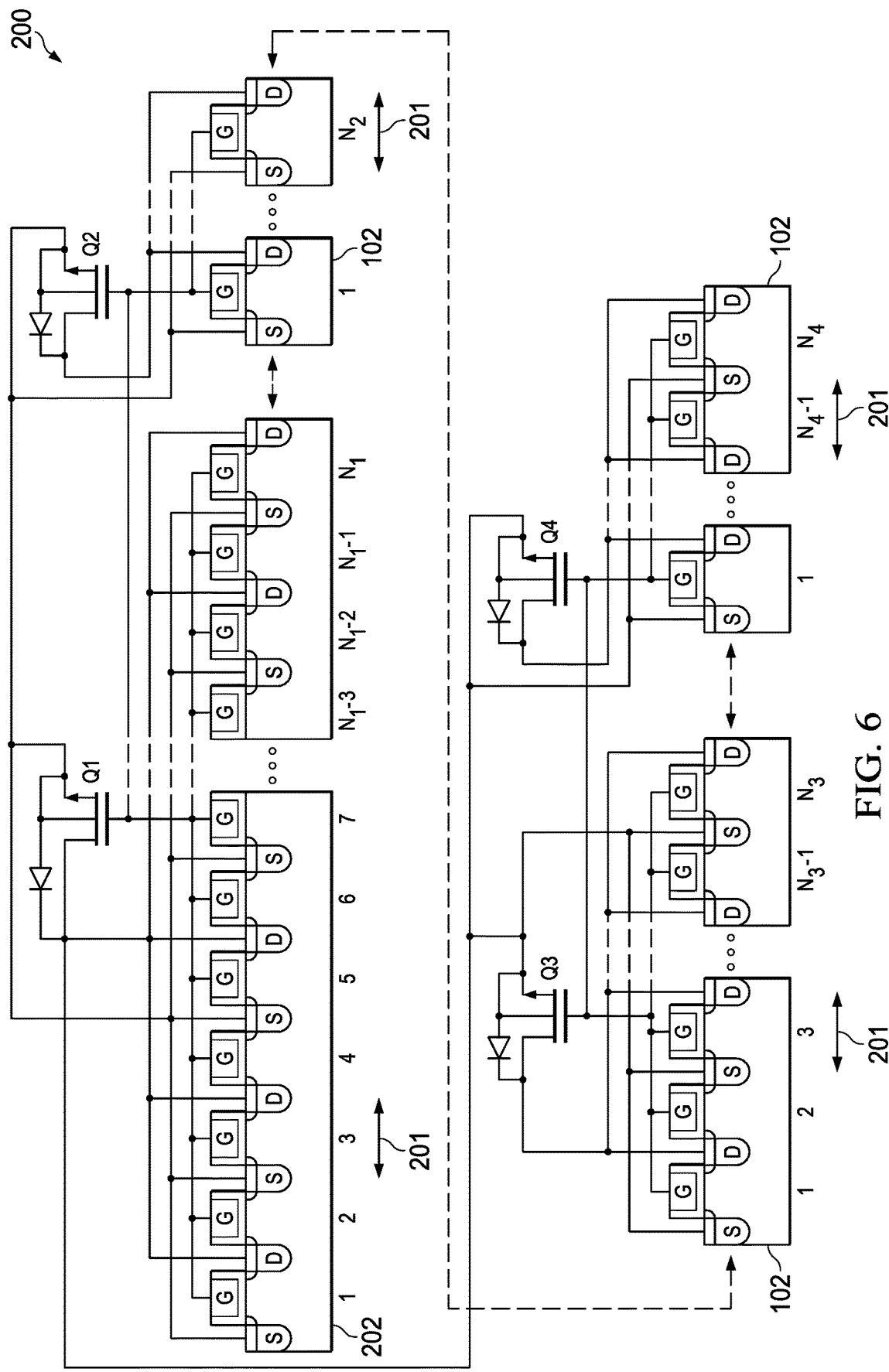
FIG. 6 is a partial side elevation view schematically illustrating field effect transistors of the sensing circuit individually formed in an integrated circuit semiconductor body using matched unit transistors.

Referring also to FIG. 6, in order to provide accurate sensing of the power transistor current $I_P$ and to facilitate reduction in sensing device power dissipation, transistor matching may be employed in certain embodiments of the sensing apparatus components 30. In particular, FIG. 6 illustrates the integrated circuit 200 having a plurality of unit MOS transistors 201 formed in/on a semiconductor body 202, such as a silicon wafer, SOI structure, etc. In one possible implementation, some or all of the sensing circuit transistors Q2-Q4 may be constructed using corresponding numbers $N_2$-$N_4$ of the unit transistors 201, which can be fabricated as LDMOS N-channel unit devices in certain embodiments. In addition, where the power transistor Q1 (and Q0, if included) are implemented in the same integrated circuit 200, these can also be built using one or more unit transistors 201.

FIG. 6 illustrates the use of unit MOS transistors 201 in constructing two or more of the transistors Q1-Q4. In one example, with Q1-Q4 constructed using the transistor units 201, each of these transistors has a corresponding integer number $N_1$-$N_4$ representing the number of units or "gate fingers" connected together to form the transistor. In order to facilitate matching characteristics of the sensing apparatus transistors, these can be built in a uniform array in the semiconductor body 202 of the integrated circuit 200. For example, Q1 may have 100 fingers ($N_1$=100), and these may be constructed all in parallel, or in subgroups of parallel-placed transistor units 201, Q2 may have just one finger ($N_2$=1) and Q3 may have just 10 fingers ($N_3$=10). Such ratios may be extended, for example, with $N_1$=1000, and $N_2$=10, etc., where the fingers for Q2 (and also or alternatively Q3) may be interleaved with those of Q1, for example, by including a Q2 finger between every group of 100 Q1 fingers in order to maximize matching accuracy with respect to dimensions as well as thermal characteristics. Moreover, as seen in FIG. 6, adjacent unit transistors 201 may, in certain instances, share source/drain regions of the semiconductor body 202.

All the individual unit FETs 201 ideally have identical channel length and width dimensions, and the number of FET cells 201 forming each of the FETs Q1-Q4 can be set according to the different current carrying capability requirements of a given design. For example, the power converter design will typically dictate the number $N_1$ of unit transistors 201 required for the conduction of the high-side current $I_P$. In particular, the channel width and other design parameters (e.g., current density limits) of the unit transistors 201 may determine the number of fingers $N_1$ required for the high-side power FET Q1. Once $N_1$ is determined, the number of fingers used for the other transistors Q2-Q4 can be set in order to reduce the size of those transistors and also to reduce the level of current flowing in the sensing circuit 22 while maintaining good accuracy. In order to set the sense current levels $I_S$ to be relatively small compared to the power current $I_P$ flowing through Q1 (and hence to increase efficiency and reduce component size and cost of the power converter 2), the ratio of $N_1/N_2$ is set in certain embodiments to be greater than 50, such as about 100 or more in one implementation. The ratio of $N_3/N_2$ is also set to be relatively high, such as about 5-10 or more in certain embodiments. Likewise, $N_3/N_4$ is set to be about 5-10 as well.

In one possible example, the transistors Q1-Q4 are constructed with $N_1$=100, $N_2$=1, $N_3$=10 and $N_4$=2. When Q1 is on (conducting), the auxiliary circuit $I_A$ and the high-side power current $I_P$ flowing through Q1 are related by the following equation (1):

$$I_P/I_A = N_1(N_2+N_3)/(N_2 N_3) \qquad (1)$$

Since Q3 and Q4 are turned on by the same gate drive voltages node 17 and are matched by the use of the unit transistors 201, the current $I_S$ through the sense FET Q4 and $I_A$ can be expressed according to following equation when their drains are kept the same by Vds matching amplifier circuit 24 (2):

$$I_A/I_S = N_3/N_4. \quad (2)$$

Based on the above equations (1) and (2), the sensing ratio can be described by the following equation (3):

$$N = \frac{I_P}{I_S} = \frac{N_1 \cdot N_3}{N_2 \cdot N_4}\left(1 + \frac{N_2}{N_3}\right), \quad (3)$$

which is the ratio between the high-side average current $I_P$ and sense current $I_S$. Since $I_P$ is much greater than $I_A$ or $I_S$, the total input current is approximately equal to $I_P$, according to the following equation (4):

$$\frac{I_{IN}}{I_S} \approx \frac{I_P}{I_S} = \frac{N_1 \cdot N_3}{N_2 \cdot N_4}\left(1 + \frac{N_2}{N_3}\right). \quad (4)$$

In the above described example with $N_1=100$, $N_2=1$, $N_3=10$ and $N_4=2$, the sensing ratio "N" of the above equation (3) is 550, and the ratio of $I_A/I_S$ of equation (2) is 5.

Referring again to FIGS. 1 and 2, diagram 28 in FIG. 2 illustrates various waveforms showing operation of the exemplary sensing apparatus 30 in the buck converter 2 of FIG. 1. In the upper curve, the shared high-side gate drive signal 12 applies to the gates of Q1 and Q2 and turns these transistors on periodically with a voltage of approximately 10 V DC ($V_{GQ1}$ and $V_{GQ2}$) in one example, where the buck converter driver circuit 10 and the converter controller 28 selectively vary the width of the high-going pulses applied via signal 12, while the gate voltage signal 17 applied to Q3 and Q4 is a constant voltage ($V_{GQ3}$ and $V_{GQ4}$), such that the corresponding auxiliary current $I_A$ and the sense current $I_S$ should be related based on the above equation (2) according to the number of unit transistors 201 used in constructing Q3 and Q4 ($N_3$ and $N_4$).

As seen in FIG. 1, with Q4 on, the sense current $I_S$ flows to the output FET Q5 of the amplifier circuit 24, whose gate is driven by the output of the op amp U1. The op amp U1, in turn, senses the voltage across Q3 by connection of the non-inverting input (+) to the first internal node 21 ($V_1$ in FIG. 2), and connection of the inverting input (−) to the circuit node 23 connected to the drain of Q4 and to the source of Q5 ($V_2$). FIG. 2 illustrates the voltages $V_1$ and $V_2$ at internal nodes 21 and 23, respectively of the sensing apparatus 30, where the activation of Q1 and Q2 does not change the level of $V_2$, but causes $V_1$ to steadily decrease from a first voltage level (e.g., about 5 V in one example) until Q1 and Q2 are again turned off, and this pattern repeats with the pulse width of the Q1 and Q2 gate signal 12 determining the ramp-down time and thus the lower value of the $V_1$ waveform. The op amp U1 reacts to the difference in the voltages at the nodes 21 and 23, and the op amp output drives the gate of Q5 so as to attempt to equalize the voltage difference. As a result, the sense current $I_S$ is essentially proportional to the current $I_P$ flowing in the high-side driver Q1. Moreover, the actuation of Q1 and Q2 via signal 12 allows conduction of the power and auxiliary currents $I_P$ and $I_A$, where the power current $I_P$ in this example rises to about 1 amp and the auxiliary current $I_A$ rises to about 10 mA in this example. As further seen in FIG. 2, the switch node voltage ($V_{SW}$ at node 6 in FIG. 1) is pulsed from approximately the circuit ground (0 V) to approximately the input voltage (e.g., about 5 V in one example) when the high-side power FET Q1 is turned on.

As previously noted, the described parallel current sensing technique is much different than the conventional current sensing approach, in which a sense FET is inserted between the input and the high-side power FET, and the disclosed apparatus and techniques provide significant advantages and improvements over the conventional implementations. In particular, for the same total Rdson, the die area of Q1 and the series transistors Q2 and Q3 in the present disclosure can be up to 75% smaller than the combined area of the high-side power FET and associated sense FET of the conventional method. In addition, the switching loss from Q1 in the present disclosure will be lower than that of the conventional approach, because the sense FETs Q2-Q4 occupy a smaller total area than the much larger sense FET of the conventional circuit. Moreover, if Q1 is designed to have the same Rdson as used in the conventional circuit, the embodiments of the present disclosure will be more efficient due to the absence of a sensing device (sense resistor or sense FET) in the power path. Also, because Rdson of Q3 in the illustrated apparatus 30 is much higher than the Rdson of the sensing FET in the conventional method, the capacitance of the filtering capacitor $C_1$ in the circuit 30 can be much less than the midpoint capacitance ($C_{PMID}$) in the conventional approach for the same filtering requirement, which makes it possible to integrate C1 on chip in an integrated circuit 200. This, in turn, allows reduction in the number of integrated circuit package connections, for example, the PMID ball in conventional wafer chip scale package (WCSP) implementations can be eliminated.

FIG. 3 illustrates another embodiment of the buck converter 2 in which the sensing apparatus 30a includes filter circuit components for low pass filtering the signals provided to the op amp inputs. In this example, a first filter resistance R3 is connected between node 21 and the non-inverting input (+) of the op amp U1, with a first filter capacitance C6 connected between the non-inverting input and the input node 4. In addition, this implementation includes a second filter resistance R4 connected between the second circuit node 23 and the inverting input (−) of U1, along with a second filter capacitance C7 connected between the non-inverting op amp input (+) of U1 and the input node 4. In this case, the low-pass filter formed by R3 and C6 provides switching ripple attenuation and removes the AC components of the sensed signal and the filter formed by R4 and C7 is to match R3 and C6 and thus better matching results. The buck converter 2 in FIG. 1 or 3 may be employed in general power conversion systems, or may be used in a switching charger with an additional high-side FET (e.g., Q6 in FIG. 7 below).

Figure 4:
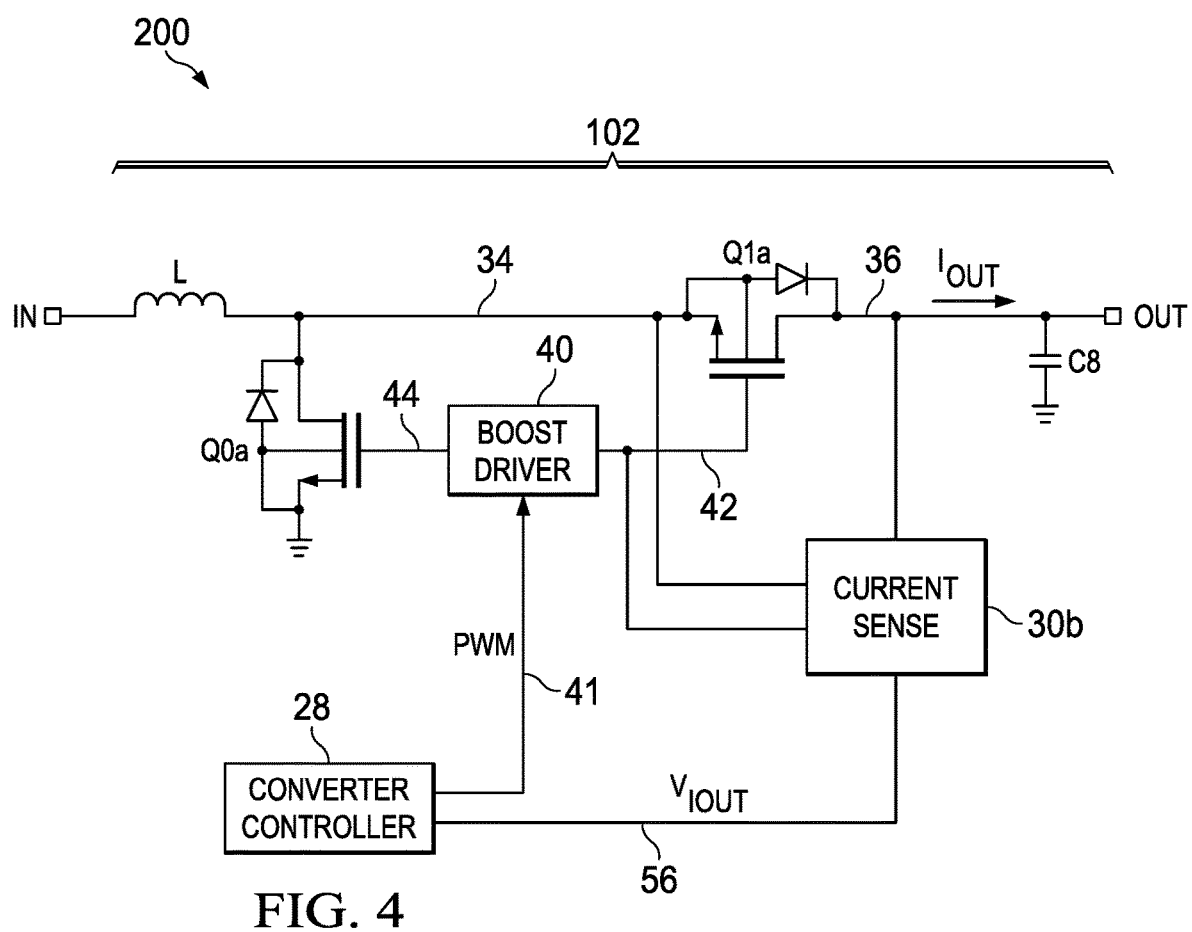
FIGS. 4 and 5 are schematic diagrams illustrating a switch mode boost converter with a sensing circuit to sense an output current flowing through a high-side power FET of the boost converter.
Figure 5:
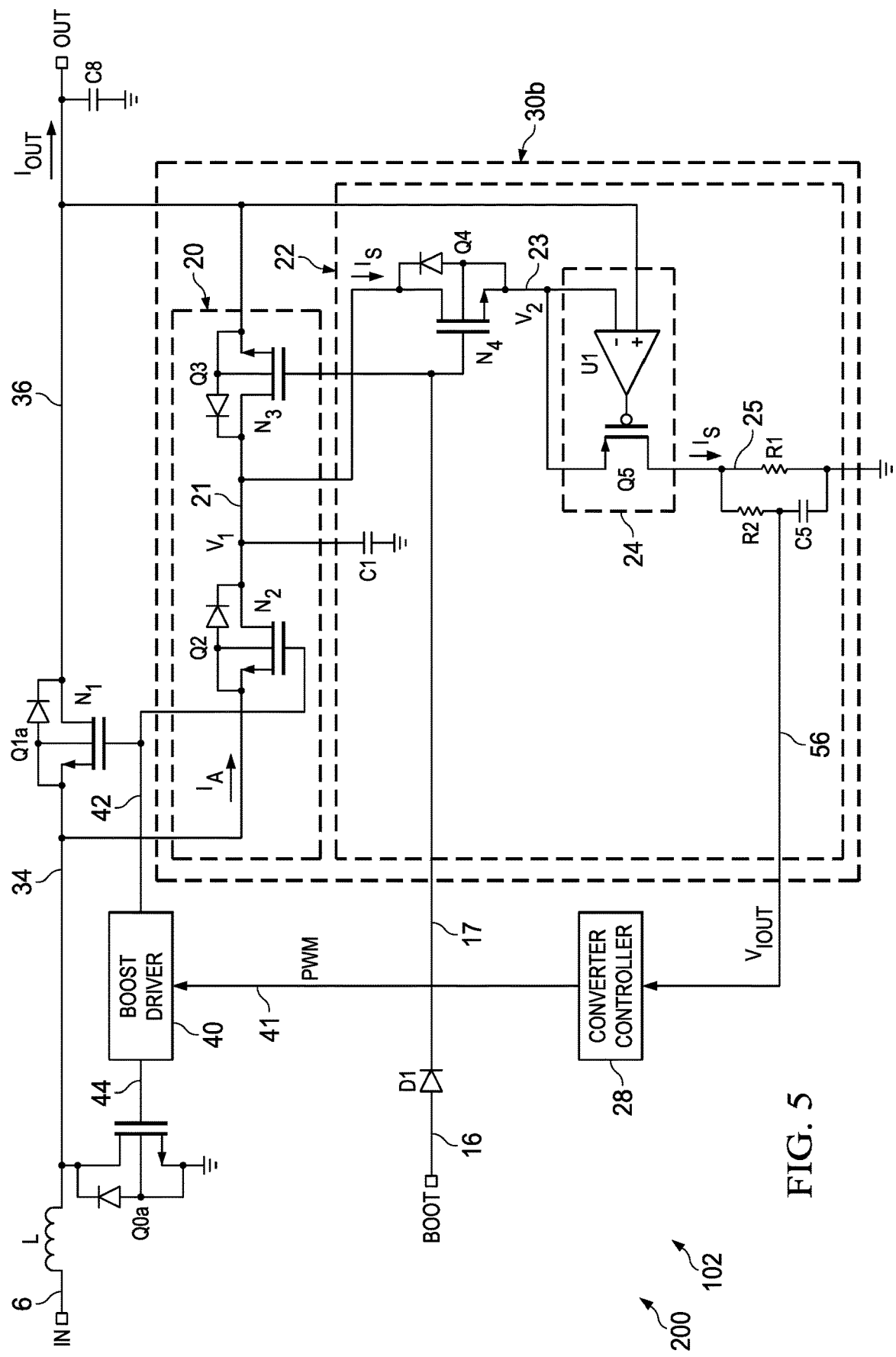

Referring also to FIGS. 4 and 5, the above-described parallel current sensing concepts can be employed in power converter systems including a boost converter 102. In the example of FIG. 4, the boost converter 102 provides a current sense circuit 30b for sensing output current $I_{OUT}$ flowing through a high-side power FET Q1a, where the boost converter 102 may be fabricated as a single integrated circuit 200 in certain embodiments. This system includes a converter inductance L connected between a DC input IN and a node 34, with the boost converter stage 102 providing output current $I_{OUT}$ to an output terminal 36. In this example, the boost converter 102 includes a current sensing circuit 30b, for sensing the output current $I_{OUT}$ flowing through a boost converter high-side power FET Q1a, where the details of the circuit 30b are further illustrated in FIG. 5.

As seen in FIG. 5, the current sensing circuit apparatus 30b is coupled across a boost converter high-side power FET Q1a, which can be an N-channel LDMOS similar to the buck converter high-side power FET Q1 described above. The boost converter 102 also includes a low-side transistor Q0a, which can be similar to the transistor Q0 described above. The boost converter inductor L connects between input node 6 and switch node 34. The low-side power FET Q0a is connected between the boost converter switch node 34 and the circuit ground, and the high-side power FET Q1a has a source terminal connected to switch node 34, a drain terminal connected to the boost converter output node 36, and the power FETs Q1a and Q0a receive gate drive signals 42, 44, respectively, from a boost driver circuit 40. The boost driver 40, in turn, operates according to a PWM signal or signals 41 from the converter controller 28, where the converter controller 28 in certain embodiments operates according to an output current feedback signal 56 ($V_{IOUT}$). In this regard, the converter controller 28 can implement any suitable closed-loop feedback control of the output current $I_{OUT}$ based on the feedback signal 56. In operation, the boost driver 40 provides the switching control signals 44 and 42 for pulse width modulated switching of Q0a and Q1a and the output current sense circuit 30b is used to sense the output current $I_{OUT}$. Alternatively, the sense current output $I_S$ can be fed into an external precision resistor for output current telemetry use.

The sensing apparatus 30b in the example of FIG. 5 operates generally as discussed above in connection with the sensing apparatus 30 of FIG. 1, with transistor Q3 connected in series with Q2 in an auxiliary series circuit branch 20 in parallel with the high-side driver Q1a, where Q2 receives the gate drive signal 42 from the boost driver 40, and Q3 operates according to a constant voltage gate drive signal on internal node 17 based on the BOOT node 16 via diode D1. Accordingly, auxiliary current $I_A$ flows through the circuit 20 when Q1a and Q2 are turned on via signal 42, and the sensing circuit 22 senses the voltage across Q3 with the sense FET Q4 conducting a sense current $I_S$ and the amplifier circuit 24 using the op amp U1 to adjust the output FET Q5 based on the voltages at input nodes 36 and 23. The amplifier circuit 24 provides the sense current $I_S$ to resistor R1 connected at node 25, with the output signal 56 being provided from the output node 25 through an optional RC low pass filter including resistor R2 and capacitor C5 as described above. Other implementations are possible using a sensor apparatus 30a as seen in FIG. 3 above in conjunction with a boost converter 102, where the sensing circuit 30a can be connected to the nodes 34 and 36 across the high-side power FET Q1a for sensing the output current $I_{OUT}$ without use of any series-connected sensing resistor or sense FET. Moreover, the boost converter 102 may include transistors (e.g., Q1a and Q2-Q4) fabricated using unit transistors 201 as described above in connection with FIG. 6.

As described above, the parallel current sensing techniques provide significant advantages over conventional techniques in which a sense resistor or sense FET was connected in series with the high-side power FET Q1 or Q1a. The present disclosure therefore presents methods for sensing input current $I_P$ flowing through a buck converter high-side power FET Q1 of a switch mode converter 2 or output $I_{OUT}$ flowing through a boost converter high-side power FET Q1a of a switch mode converter 102 in which a voltage is sensed across a first FET Q3 connected in a series circuit branch 20 in parallel with the power FET Q1 or Q1a, and an output signal 26, 56 is provided at least partially according to the sensed voltage so as to indicate the current $I_P$, $I_{OUT}$ flowing in the power transistor Q1, Q1a. The method may further include turning on the power transistor Q1 and the other series-connected FET (e.g., Q2) of the circuit branch 20 according to a shared PWM gate control signal 12 or 42 from a driver 10 or 40 of the switch mode converter 2 or 102, as well as sensing the voltage across Q3. In certain embodiments, moreover the method includes controlling the gate terminal of the output FET Q5 using an op amp (U1) at least partially according to the sensed voltage in order to provide a current output (e.g., $I_S$ in FIG. 1) indicative of the current $I_P$ flowing through the power FET Q1 or $I_{OUT}$ flowing through power FET Q1a. In addition, the method may include controlling the gate of a sense FET Q4 connected between the node 4 for a buck converter in FIGS. 1 and 3 or node 21 for a boost converter in FIG. 5) and the source of the output FET Q5 at a constant voltage which is also provided to the gate of Q3 while sensing the voltage across Q3.

Figure 7:
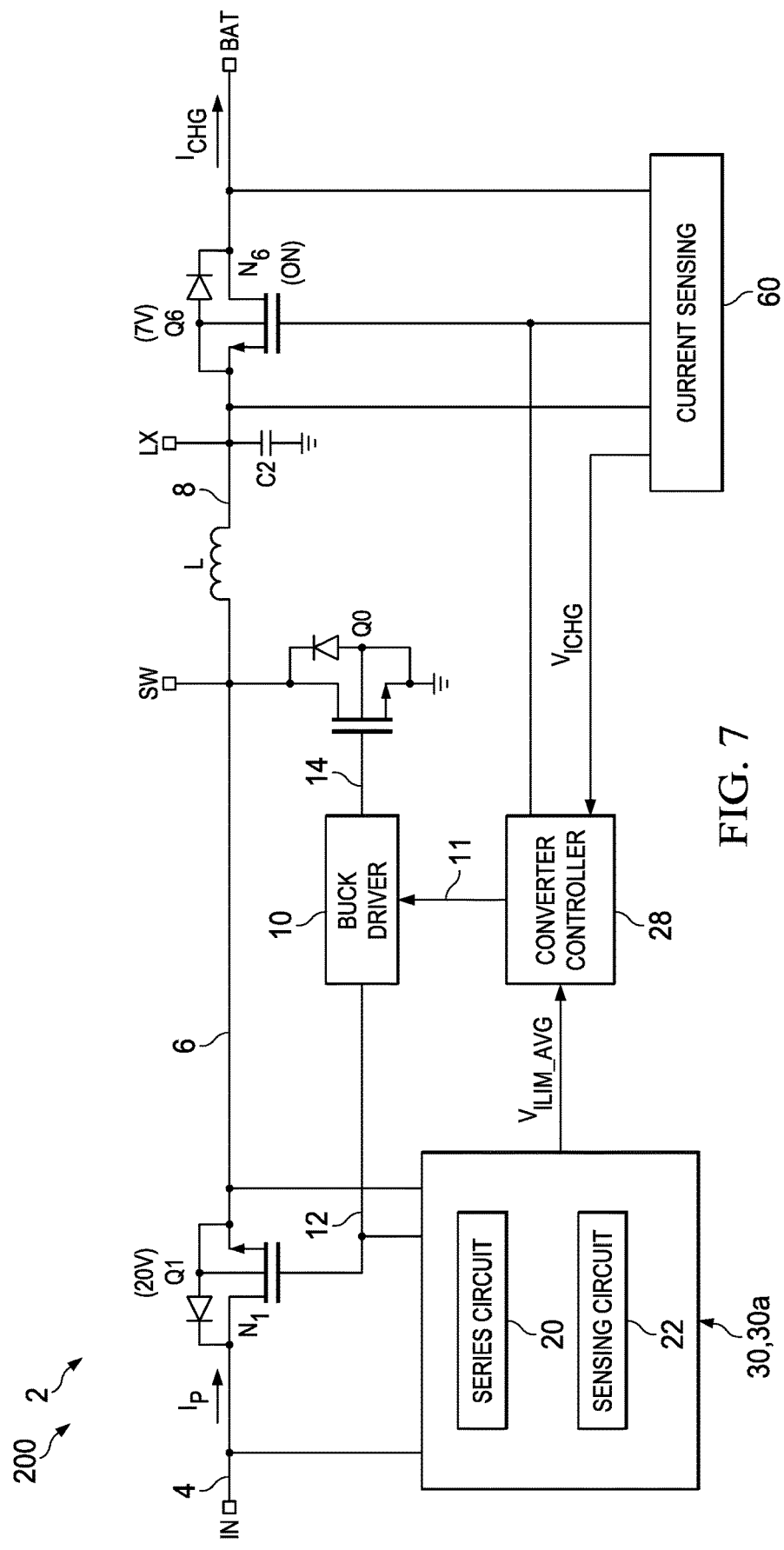
FIG. 7 is a schematic diagram illustrating an exemplary switch mode charger circuit including a buck converter and a power FET (Q6) for reverse blocking and charge current sensing.

FIG. 7 illustrates an exemplary switching charger circuit 2 including a buck converter 2 and a high-side FET Q6 for reverse blocking and sensing the charging current $I_{CHG}$ provided to a battery circuit (not shown). The charger circuit 2 includes a buck converter formed by Q1, Q0 and inductor L as described above in connection with FIGS. 1 and 3, and additionally FET Q6, coupled between the node 8 (identified as LX in FIG. 7) and a battery charger output terminal BAT, provides charge current sensing/reverse blocking. Q6 performs reverse blocking in this embodiment to isolate the battery from the input node 4 when a charging source is removed. When a charging source is available and valid, Q6 turns on fully and the rest of circuit operates as a buck switch mode charger. When the charging source is removed or invalid, Q6 turns off and switch mode charger stops charging. Some conventional current sensing circuit 60 can be used to sense the charging current $I_{CHG}$ flowing through Q6 since Q6 is fully on (not switching). A signal (e.g., a voltage signal in this case) $V_{ICHG}$ representing the charging current $I_{CHG}$ flowing through Q6 is provided by the sensing circuit 60, which charging current feedback signal may be employed by the converter controller 28 in one embodiment. In addition, an input current sensing circuit 30, 30a may be provided across the buck converter high-side FET Q1 as described above to provide input average current feedback and regulation. Other implementations of the parallel current sensing concepts of the present disclosure may be employed in general switch mode converters and/or switch mode charging circuits, wherein the present disclosure is not limited to the illustrated embodiments.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An integrated circuit, comprising:
a first transistor having a first drain, a first gate, and a first source;
a switch node coupled to the first source;
an auxiliary circuit having a first terminal coupled to the first drain and a second terminal coupled to the first source, the auxiliary circuit including a second transistor having a second drain, a second gate coupled to an internal node configured to receive a constant voltage, and a second source coupled to the first drain of the first transistor; and
a sense circuit including a third transistor having a third drain, a third gate coupled to the internal node configured to receive the constant voltage, and a third source coupled to the second source and the first drain.

2. The integrated circuit of claim 1, wherein the auxiliary circuit includes a fourth transistor having a fourth drain coupled to the second drain of the second transistor, a fourth gate coupled to the first gate of the first transistor, and a fourth source coupled to the first source of the first transistor.

3. The integrated circuit of claim 1, wherein the auxiliary circuit includes a capacitor having a first terminal coupled to the second drain of the second transistor, and a second terminal coupled to a ground node.

4. The integrated circuit of claim 1, further comprising:
a voltage input terminal, wherein the first drain of the first transistor is coupled to the voltage input terminal.

5. The integrated circuit of claim 1, further comprising:
a converter controller configured to generate a pulse width modulation (PWM) signal based on a sense voltage received from the sense circuit; and
a buck driver configured to generate a driver signal based on the PWM signal received from the converter controller, and the buck driver configured to deliver the driver signal to the first gate of the first transistor.

6. The integrated circuit of claim 1, further comprising:
a voltage output terminal, wherein the first drain of the first transistor is coupled to the voltage output terminal.

7. The integrated circuit of claim 1, further comprising:
a converter controller configured to generate a pulse width modulation (PWM) signal based on a sense voltage received from the sense circuit; and
a boost driver configured to generate a driver signal based on the PWM signal received from the converter controller, and the boost driver configured to deliver the driver signal to the first gate of the first transistor.

8. The integrated circuit of claim 1, further comprising:
a high side switch including the first transistor;
a low side switch including a fourth transistor having a fourth drain coupled to the switch node, a fourth gate, and a fourth source coupled to a ground node; and
a driver circuit configured to generate a first driver signal for the high side switch, and a second driver signal for the low side switch.

9. The integrated circuit of claim 1, further comprising:
a diode including an anode coupled to a ground node, and a cathode coupled to the switch node.

10. An integrated circuit, comprising:
a first transistor having a first drain, a first gate, and a first source;
a switch node coupled to the first source;
an auxiliary circuit coupled in parallel with the first transistor, the auxiliary circuit including a second transistor having a second drain, a second gate coupled to an internal node configured to receive a constant voltage, and a second source coupled to the first drain of the first transistor;
a sense circuit coupled between the second source and the second drain of the second transistor, the sense circuit configured to generate a sense voltage representative of an auxiliary current to be conducted by the second transistor;
a converter controller coupled to the sense circuit and configured to generate a pulse width modulation (PWM) signal based on the sense voltage received from the sense circuit;
a buck driver coupled between the converter controller and the first gate and configured to generate a driver signal based on the PWM signal received from the converter controller, the buck driver configured to deliver the driver signal to the first gate of the first transistor; and
wherein the sense circuit includes a third transistor having a third drain coupled to the second drain of the second transistor, a third gate coupled to the internal node configured to receive the constant voltage, and a third source.

11. The integrated circuit of claim 10, wherein the third source coupled to the first drain of the first transistor.

12. The integrated circuit of claim 10, wherein the auxiliary circuit includes a fourth transistor having a fourth drain coupled to the second drain of the second transistor, a fourth gate coupled to the first gate of the first transistor, and a fourth source coupled to the first source of the first transistor.

13. A USB Power Delivery (PD) device, comprising:
an input terminal, a switch node, and an output terminal;
a first transistor having a first drain coupled to the input terminal, a first gate, and a first source coupled to the switch node;
an auxiliary circuit having a first terminal coupled to the first drain and a second terminal coupled to the first source, the auxiliary circuit including a second transistor having a second drain, a second gate coupled to an internal node configured to receive a constant voltage, and a second source coupled to the first drain; and
a sense circuit including a third transistor having a third drain, a third gate coupled to the second gate, and a third source coupled to the second source and the first drain.

14. The USB PD device of claim 13, wherein the auxiliary circuit includes a fourth transistor having a fourth drain coupled to the second drain of the second transistor, a fourth gate coupled to the first gate of the first transistor, and a fourth source coupled to the first source of the first transistor.

15. The USB PD device of claim 13, wherein the auxiliary circuit includes a capacitor having a first terminal coupled to the second drain of the second transistor, and a second terminal coupled to a ground node.

16. The USB PD device of claim 13, further comprising:
a high side switch including the first transistor;
a low side switch including a fourth transistor having a fourth drain coupled to the switch node, a fourth gate, and a fourth source coupled to a ground node; and
a driver circuit configured to generate a first driver signal for the high side switch, and a second driver signal for the low side switch.

17. The USB PD device of claim 13, further comprising:
a converter controller configured to generate a pulse width modulation (PWM) signal based on a sense voltage received from the sense circuit; and a buck driver configured to generate a driver signal based on the PWM signal received from the converter controller, and the buck driver configured to deliver the driver signal to the first gate of the first transistor.

\* \* \* \* \*